United States Patent [19]
Hyodo

[11] Patent Number: 5,426,321
[45] Date of Patent: Jun. 20, 1995

[54] SEMICONDUCTOR MEMORY ELEMENT AND SEMICONDUCTOR MEMORY DEVICE

[75] Inventor: Toshihiro Hyodo, Toyonaka, Japan

[73] Assignee: Ricoh Company, Ltd., Tokyo, Japan

[21] Appl. No.: 978,808

[22] Filed: Nov. 19, 1992

[30] Foreign Application Priority Data

Nov. 22, 1991 [JP] Japan .................. 3-334289

[51] Int. Cl.⁶ ........................... H01L 29/78
[52] U.S. Cl. .................... 257/329; 257/391; 365/104
[58] Field of Search ........ 257/329, 391, 390; 365/104

[56] References Cited
U.S. PATENT DOCUMENTS 4,663,644   5/1987   Shimizu ............... 257/391
5,306,941   4/1994   Yoshida .............. 257/391

FOREIGN PATENT DOCUMENTS 61-263152  11/1986  Japan .................. 257/390

Primary Examiner—Mark V. Prenty
Attorney, Agent, or Firm—Cooper & Dunham

[57] ABSTRACT

The present invention relates to a semiconductor memory device having a planner cell structure. A source with a large area is formed on a P-type silicon substrate, a plurality of strip-like word lines are formed in parallel to each other on the source, gate oxide films are formed on both side walls of each of the word lines, and an epitaxial layer is formed between the word lines. A plurality of strip-like bit lines are formed in parallel to each other perpendicularly to the word lines on the oxide film, and the epitaxial layer, and a drain is formed in the epitaxial layer under a polycrystalline silicon film of the bit line. A channel is formed in contact with the gate oxide film between the drain and the source in the epitaxial layer, and an electric current flows in a longitudinal direction when a memory element becomes ON.

2 Claims, 5 Drawing Sheets

SEMICONDUCTOR MEMORY ELEMENT AND SEMICONDUCTOR MEMORY DEVICE

BACKGROUND OF THE INVENTION

1. Field of the Invention

The present invention relates to a semiconductor memory device having a planar cell structure.

2. Description of the Related Art

In general, a MOS type semiconductor integrated circuit device is formed in such a way that a field oxide film is used for device isolation and that a source region and a drain region are formed by diffusing impurities in a substrate by a self-alignment method with the use of a gate electrode as a mask. One or two contacts are required for connecting the source region and the drain region per one transistor. It is therefore necessary for the margin to take a space for the contacts and wirings, which impedes the realization of high integration of a device.

In order to improve this point, a semiconductor integrated circuit device having a planar cell structure has been proposed in Japanese Patent Application Laying Open (KOKAI) Nos. 61-288464 and 63-96953. In the planar cell structure, the first continuous diffusion region for a plurality of MOS transistor source regions and the second continuous diffusion region for a plurality of MOS transistor drain regions are formed in parallel to each other on a substrate. A word line is formed crossing over the both diffusion regions on the substrate through an electrically insulating film.

In the planar cell structure, it becomes unnecessary to form a field oxide film for device isolation. The source region and the drain region are formed to be used in common to a plurality of MOS transistors. It is therefore sufficient to provide one contact in proportion to several or several tens of transistors, which makes it possible to realize a compact IC device of high density.

An embodiment of a conventional planar cell structure is shown in FIGS. 1a and 1b. FIG. 1a shows a memory part and FIG. 1b is a cross-sectional view showing a little simplified memory part, together with one portion of a peripheral transistor part.

A channel stopper layer 54 and a field oxide film 58 are formed in order to isolate the peripheral transistor part from the memory part and also isolate the peripheral transistors from each other.

In the memory part, continuous N-type diffusion layers 42s, 42d for constituting a plurality of memory transistors are formed in strips in parallel to each other. Word lines 48 constituted by a polycrystalline silicon layer and functioning also as a gate electrode is formed on a substrate 40 through a gate oxide film 44 as well as on the diffusion layers 42s, 42d through a silicon oxide film 46 thicker than the gate oxide film 44. Each of the word lines 48 extends in a direction crossing perpendicularly over a longitudinal direction of the diffusion layers 42s, 42d.

In the peripheral transistor part, reference numeral 50s denotes a source, 50d denotes a drain. A gate electrode 52 constituted by a polycrystalline silicon layer is formed through a gate oxide film 44 on the substrate 40.

In the memory part, the rectangular area 54 defined by a dash-dot line (FIG. 1a) represents one memory transistor. In each memory transistor, a threshold value thereof is adjusted and set by controlling an ion implantation in order to determine a ROM code thereof. For example, the threshold value is raised by implanting boron into a channel region of each memory transistor, or the threshold value is kept low by not implanting impurities into the channel region. When the word line 48 of the memory transistor 54 is selected and a voltage is applied thereto, if the threshold value of the memory transistor 54 is low, current flows from a bit line (drain) 42d to the source 42s. On the other hand, if the threshold value is high, a current does not flow so that the data stored in ROM can be read by a sensing circuit connected to the bit line 42d.

In the planar cell structure, when a more minute device is intended to be produced, a miniaturization of the device is impeded due to a short channel effect caused by the diffusion layers 42s, 42d. In an ordinal MOS transistor such as the peripheral transistor, the problem of the short channel effect can be avoided by employing Lightly Doped Drain (LDD) structure for the diffusion layers, while it is structurally difficult to employ the LDD structure for the planar cell structure.

Since the bit line 42d and the source 42s are constituted by the diffusion layers formed on the substrate 40, a resistance value is high. Also, junctions are formed on bases and side walls of the drain 42d and the source 42s thereby to produce parasitic capacity. Therefore, it can be considered that a functional speed of the device is delayed by these high resistance and parasitic capacity.

SUMMARY OF THE INVENTION

It is therefore an object of the present invention to further integrate a planar cell structure and accelerate a functional speed thereof.

According to the present invention, the above-mentioned object is achieved by a semiconductor memory element comprising
- a source region;
- a strip-like word line formed on the source region through a lower insulating film;
- gate oxide films formed respectively on both side walls of the word line;
- silicon epitaxial layers formed respectively on the source region in contact with both side walls of the gate oxide film;
- an upper insulating film formed on the word line; and
- a bit line formed on the upper insulating film and on the epitaxial layer in a direction crossing over the word line, the epitaxial layer having a channel region in a direction of a thickness thereof, so that impurities are introduced into the channel region depending on data to be stored, thereby to raise a threshold voltage to such an extent that the semiconductor memory element does not operate with a power voltage, or by a semiconductor memory device comprising:
- a source region;
- a plurality of word lines each formed in shape of strip on the source region through an insulating film, the word lines being in parallel to each other;
- gate oxide films formed respectively on both side walls of each of the word lines;
- silicon epitaxial layers formed respectively on the source region in contact with the gate oxide films;
- upper insulating films each formed on each of the word lines;

a plurality of bit lines formed in parallel to each other on the upper insulating films and on the epitaxial layer in a direction crossing over the word lines; and the epitaxial layers having respectively channel regions in a direction of a thickness, so that impurities are introduced into the channel regions depending on data to be stored, thereby to raise a threshold voltage to such an extent that the semiconductor memory device does not operate with a power voltage.

According to the present invention, the above-mentioned object is achieved by a method of producing a semiconductor memory device comprising the steps of:

introducing a first conductive-type impurity into a silicon substrate thereby to form a source region;

forming a lower insulating film on the source region, a first conductive-type film on the lower insulating film, and further an upper insulating film on the first constructive film, the first conductive-type film having a polycrystalline silicon film on the lower insulating film, or having a polycrystalline silicon film on the lower insulating film, and a refractory metal film or a refractory metal silicide film on the polycrystalline silicon film;

patterning the upper insulating film, the first conductive film and the lower insulating film thereby to form strip-like word lines in parallel to each other;

forming gate oxide films on both side walls of each of the word lines;

forming a second conductive-type silicon epitaxial layer in an area between the word lines;

introducing a second conductive-type impurity into a region thereby to raise a threshold voltage to such an extent that the semiconductor memory device does not function with a power voltage, the region being selected in accordance with data to be stored among regions which are to become channel regions in the epitaxial layer;

forming a second conductive film on the upper insulating film and on the epitaxial layer, the second conductive film having a polycrystalline silicon film including the first conductive-type impurity, or having the polycrystalline silicon film and a refractory metal film or a refractory metal silicide film on the polycrystalline silicon film;

patterning the second conductive film into strips in parallel to each other crossing over the word lines; and diffusing the impurities included in the polycrystalline silicon film of the second conductive film into the epitaxial layer by heat treatment thereby to form a drain region.

Advantages of the present invention are described hereinafter.

In the claimed construction of the present invention, a silicon epitaxial layer is formed through the gate oxide film on the side walls of the word line functioning also as a gate electrode, and the channel region is formed in this epitaxial layer. Therefore, a length of the channel of the memory transistor is determined by the film thickness of the epitaxial layer, which does not impede miniaturization of the device. A channel is formed per gate electrode on each of both sides thereof, so that on-state current can be obtained twice in amount that in an ordinal device.

The memory transistor has a vertical structure, so that a drain side region of the planar structure described as a conventional embodiment becomes unnecessary, thereby realizing a device with high density.

The resistance of the source is reduced due to its large area. With respect to the capacity, the length of the channel is determined by a film coating thickness of the epitaxial layer, and even if the device is thus miniaturized, it is not needed to thin the gate oxide film, therefore it is possible to impede the increase of the capacity of MOS. Further, by forming a source region with a large area, a peripheral length of the memory diffusion layer can be reduced and a junction capacitance can be reduced. Thus obtained lowered resistance and reduced junction capacitance allows to accelerate the function speed of the device.

Since the channel dope can be adjusted by controlling a density of the epitaxial layer, this method causes less defects than the ion implantation method, and density profile of the dopant is ameliorated, so that a stable threshold value can be obtained.

Further objects and advantages of the present invention will be apparent from the following description of the preferred embodiments of the invention as illustrated in the accompanying drawings.

DESCRIPTION OF THE PREFERRED EMBODIMENTS

Figure 1A:
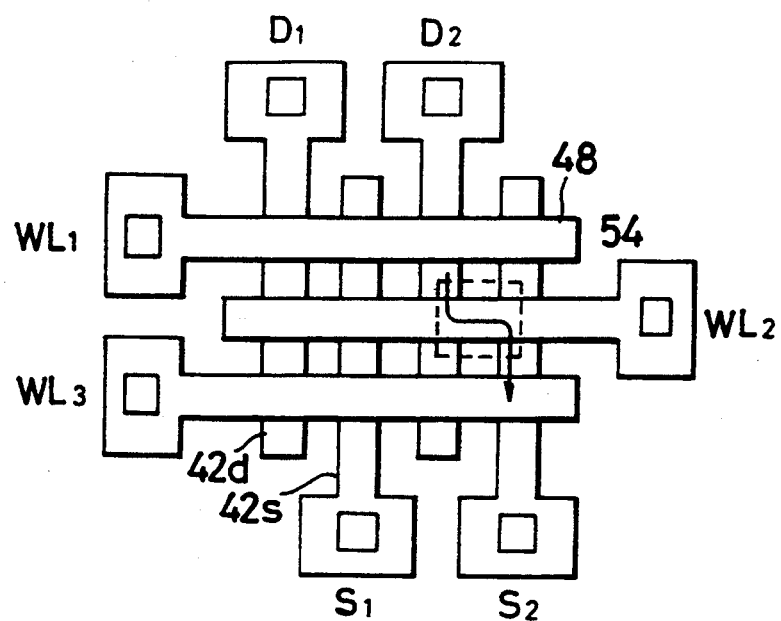
FIG. 1a is a plane view showing a conventional planar structure.
Figure 1B:
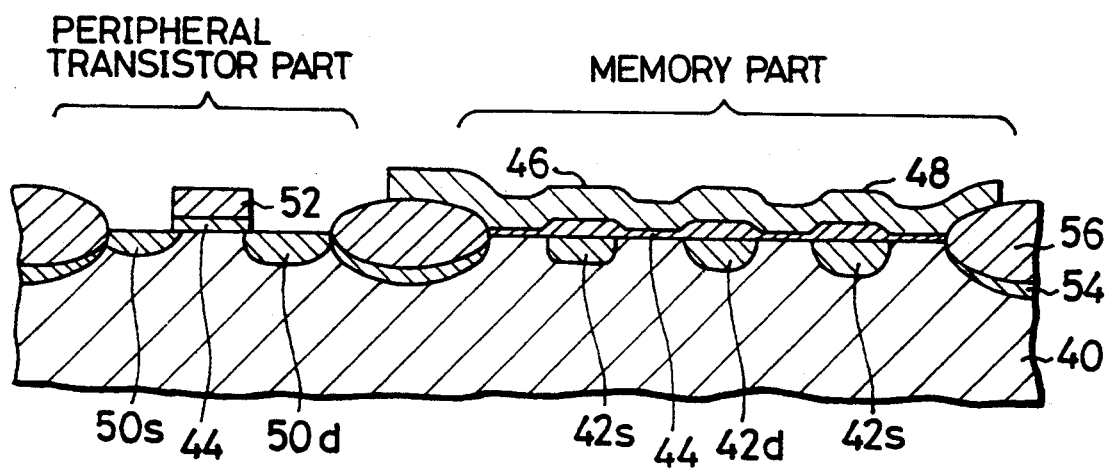
FIG. 1b is a cross-sectional view of a conventional planar structure including a peripheral transistor.
Figure 2:
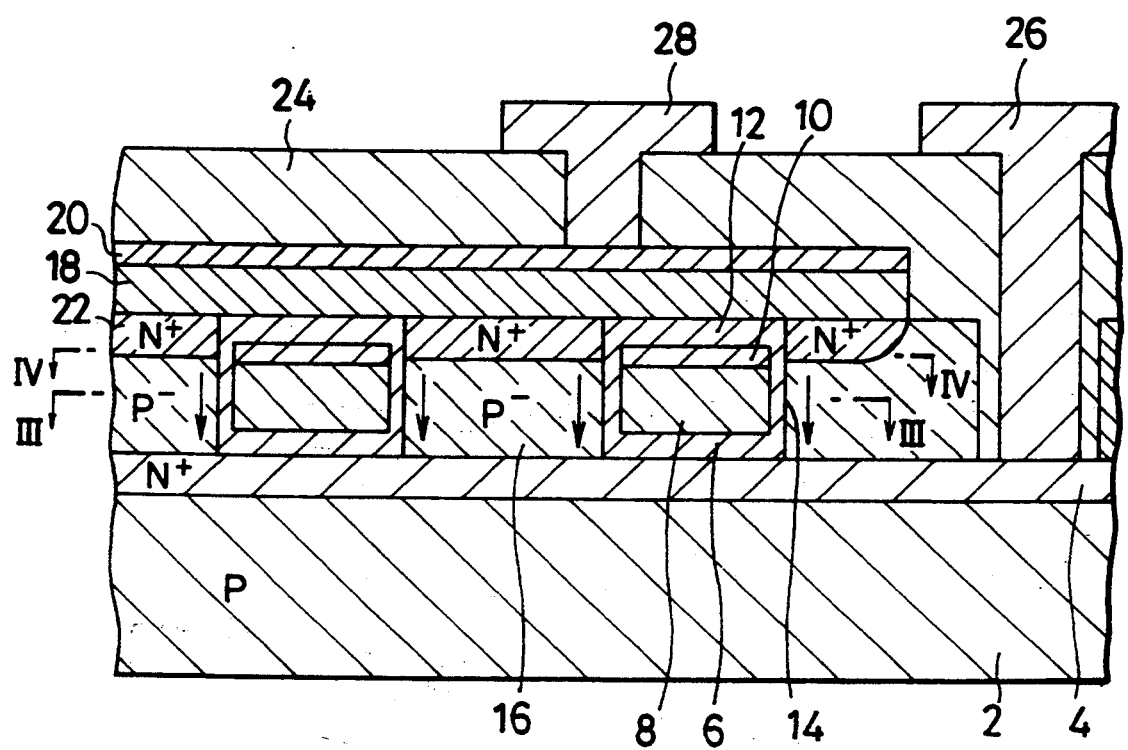
FIG. 2 is a cross-sectional view showing one embodiment of the present invention.
Figure 3:
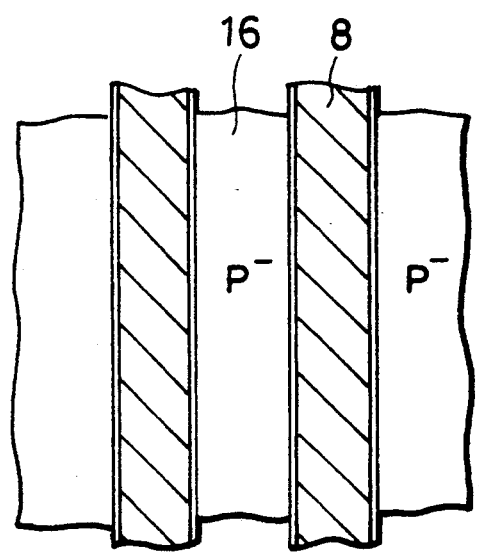
FIG. 3 is a cross-sectional view taken along the line III—III in FIG. 2.
Figure 4:
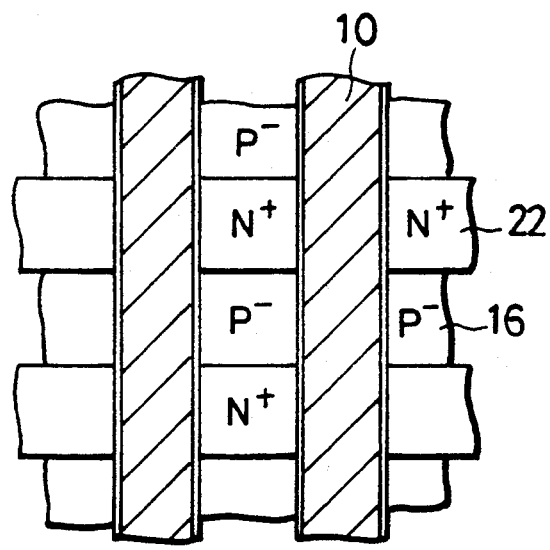
FIG. 4 is a cross-sectional view taken along the line IV-IV in FIG. 2.
Figure 5A:
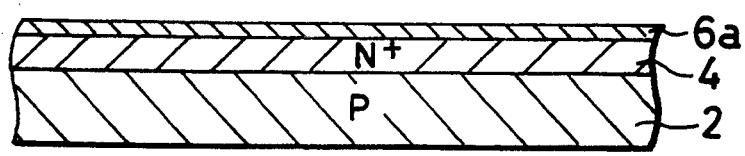
FIGS. 5a to 5h are cross-sectional views in different steps showing an embodiment of the producing process in accordance with the present invention.
Figure 5B:
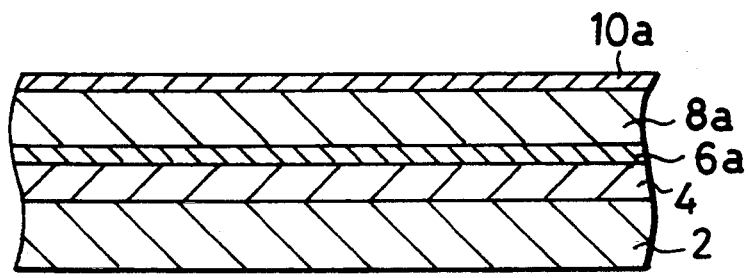
Figure 5C:
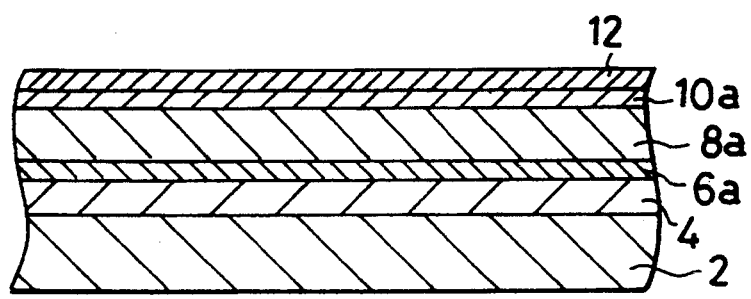
Figure 5D:
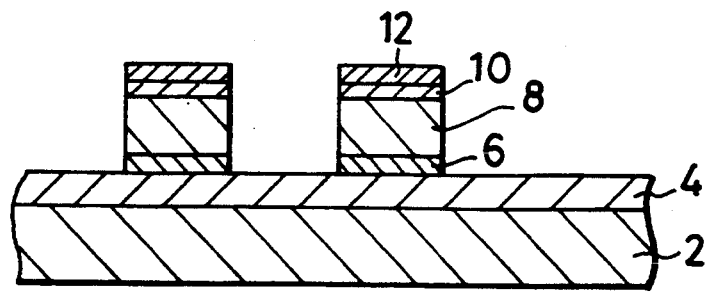
Figure 5E:
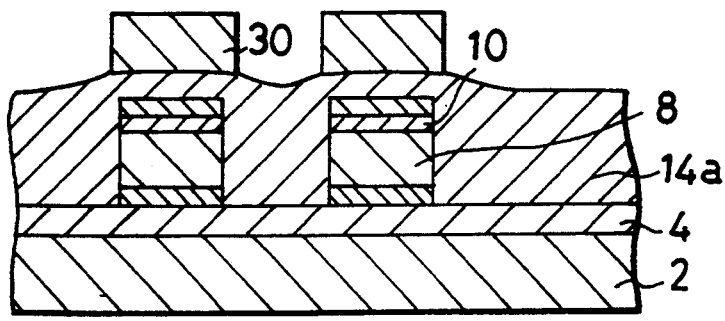
Figure 5F:
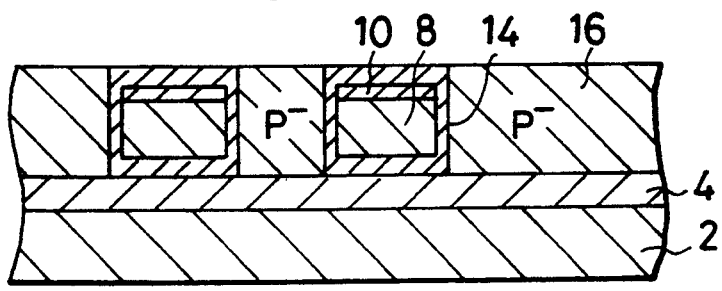
Figure 5G:
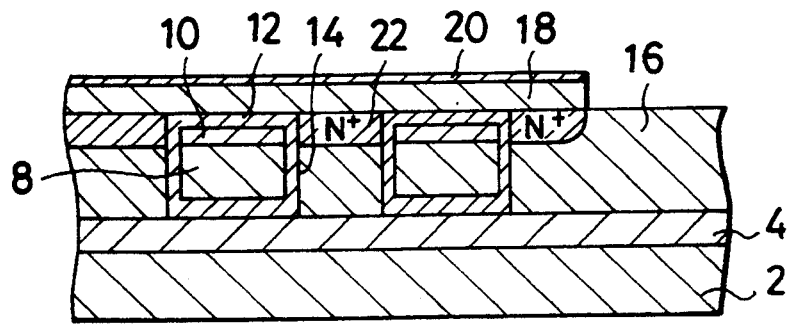
Figure 5H:
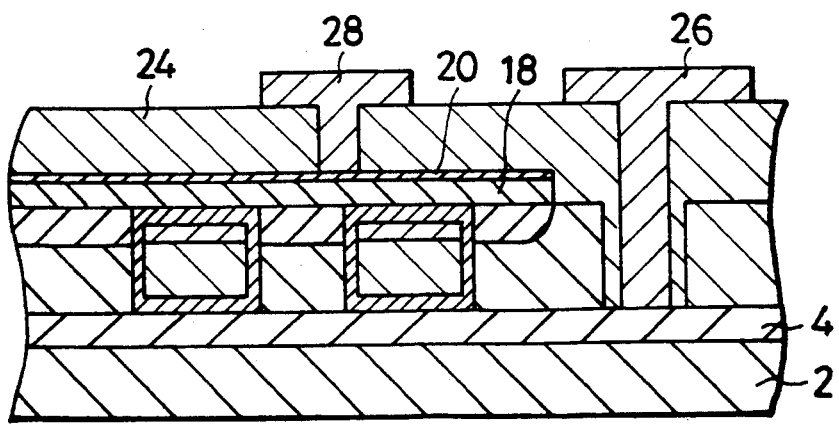

FIG. 2 is a cross-sectional view showing one embodiment of the present invention, FIG. 3 is a cross-sectional view taken along the line III—III in FIG. 2, FIG. 4 is a cross-sectional view taken along the line IV—IV in FIG. 2. It is noted that FIGS. 3 and 4 are illustrated in reduced size of FIG. 2.

A N-type diffusion layer 4 of a large area is formed by introducing N-type impurities consisting of arsenic, phosphorus or the like into a P-type silicon substrate 2. The diffusion layer 4 is a diffusion region which functions as a source of a memory element, and is not patterned over a large area which is used in common by a plurality of memory elements. On the source 4, a plurality of strip-like word lines are formed in parallel to each other, and extends perpendicularly to the sheet of the Figure. The word lines each is constituted by a conductive layer consisting of a polycrystalline silicon film and a tungsten film 10 of a refractory metal formed on the polycrystalline silicon film 8, the word lines functioning also as a gate electrode. The tungsten film 10 may be substituted with a refractory metal silicide film. A thick oxide film 6 is formed between the word line 8, 10 and the source 4 to insulate the word lines. Also, on the tungsten film 10 of the word line, a thick oxide film 12 is formed to insulate the tungsten film 10. A gate oxide film 14 is formed on each of both side walls of the word line 8, 10.

In the region between the word lines, a P-type silicon epitaxial layer 16 is formed on the source 4, and a channel region is formed in the epitaxial layer 16. The channel density is adjusted by controlling the density of this epitaxial layer 18.

On the thick oxide film 12, and on the epitaxial layer 16, a plurality of bit lines are formed in strips in parallel to each other perpendicularly to the word lines. The bit lines each consists of a polycrystalline silicon film 18, a tungsten film 20 of a refractory metal formed on the polycrystalline silicon film 18, and a N-type impurity diffusion layer 22 formed in the epitaxial layer 18 on a lower side of the polycrystalline silicon film 18. The diffusion layer 22 functions as a drain. Reference numeral 24 denotes an interlayer insulating film. Contact holes are formed in the interlayer insulating film 24. A metal wiring 26 is connected to the source 4 through the contact hole, and a metal wiring 28 is connected to the bit line. The metal wirings 26, 28 are made of aluminum or the like.

The word line 8, 10 functions as a gate electrode, and an area between the drain 22 of an upper side and the source 4 in the epitaxial layer 16 in contact with the gate oxide film 14 functions as a channel region. When the memory element becomes ON, a current flows in a direction as illustrated by the arrow shown in the Figure.

In the memory element, P-type impurities are introduced into the channel region depending on data to be stored, thereby to raise a threshold value in such a manner that the memory element does not operate with a power voltage.

A method of producing the above-mentioned embodiment will be described hereinafter with referring to FIGS. 5a to 5h.

(A) N-type impurities consisting of arsenic or phosphorus or the like are implanted into a P-type silicon substrate 2 at a density of ion of about $10^{14}$ to $10^{18}$ with 30 to 50 KeV to form a N-type diffusion layer 4 which will functions as a source of a memory transistor. On the diffusion layer 4, a thick oxide film 6a is formed to insulate the diffusion layer 4 by a thermal oxidation method or a CVD method.

(B) A polycrystalline silicon film 8a is deposited on the oxide film 8a to form the word line functioning as a gate electrode of a memory transistor, and further a tungsten film 10a as a refractory metal film is deposited on the polycrystalline silicon film 8a in order to reduce a resistance of the word line.

(C) A thick oxide film 12a is deposited on the tungsten film 10a by the CVD method to insulate the tungsten film 10a.

(D) The oxide film 12a, the tungsten film 10a, the polycrystalline silicon film 8a and the oxide film 6a are patterned by a photolithographical process and by etching to form word lines. The word lines are strip-like patterns formed in parallel to each other, and extends perpendicularly to the sheet of the figure. This extending direction is perpendicular to bit lines which will be formed later. The word lines each includes the polycrystalline silicon film 8 and the tungsten film 10. The thick oxide film 6 exists on a lower side of the word line, and the thick oxide film 12 exists also on an upper side of the word line.

(E) In order to form a gate oxide film on side walls of the polycrystalline silicon film 8 and the tungsten film 10, an oxide film 14a is thickly deposited. A resist pattern 30 is formed on the oxide film 14a. The oxide film 14a is etched with the use of the resist pattern 30 as a mask thereby to be remained on the side walls of the word line as a gate oxide film.

(F) Next, a P-type silicon epitaxial layer 16 which will become a channel region is formed. The channel density is adjusted by controlling a density of the epitaxial layer 16.

(G) In order to form a bit line, a polycrystalline silicon film including arsenic or phosphorus is formed on the epitaxial layer 16, and a tungsten film as a refractory metal film for reducing a resistance is formed on the polycrystalline silicon film. These films are patterned by a photolithographical process and by etching to form the polycrystalline silicon film 18 and the tungsten film 20, both in strips in parallel to each other, extending in a sheet plane of the Figure and perpendicularly crossing over the word lines.

After that, arsenic or phosphorus in the polycrystalline silicon film 18 is driven in the epitaxial layer 16 by applying a heat treatment to form a drain 22. Since oxide films 12, 14 covers the polycrystalline silicon film 8 of the gate electrode, arsenic or phosphorus is not driven in the polycrystalline silicon film 8.

(H) An interlayer insulating film 24 is deposited, contact holes are formed and metal wirings 26, 28 are formed.

With respect to a core implantation for writing according to the data, after having formed the epitaxial layer 16 in the Step (F) and before depositing the polycrystalline silicon film for the bit line ions are implanted into an required channel region of a memory transistor to raise a threshold voltage of the memory transistor to such an extent that the memory transistor does not operate with a power voltage.

The present invention is not limited to the contents described in the embodiments. For example, the word line and the bit line each has a double-layered structure including the polycrystalline silicon film and the tungsten film. However, any other refractory metal film may be used instead of the tungsten film, and further a silicide film of refractory metal may be used. Thus, each of the word line and the bit line is formed to have a polycide structure whereby the resistance can be reduced and the functional speed can be accelerated. However, where permissible, they do not necessarily have the polycide structure, but they may have one layered-structure consisting of a polycrystalline silicon film having a reduced resistance.

Many widely different embodiments of the present invention may be constructed without departing from the spirit and scope of the present invention. It should be understood that the present invention is not limited to the specific embodiments descried in the specification, except as defined in the appended claims.

What is claimed is:

1. A semiconductor memory element comprising: a source region;
   a strip-like word line formed on said source region through a lower insulating film;
   gate oxide films formed respectively on both side walls of said word line;
   a silicon epitaxial layer formed on said source region in contact with both gate oxide films;
   an upper insulating film formed on said word line;

a strip-like bit line formed on said upper insulating film and on said silicon epitaxial layer in a direction crossing over said word line, wherein said silicon epitaxial layer is situated on both sides of said word line through the gate oxide films and has channel regions in surface regions facing the gate oxide films, and wherein impurities are introduced into said channel regions where data should be stored, thereby setting a threshold voltage of said semiconductor memory element.

2. A semiconductor memory device comprising:

a source region;

a plurality of word lines each formed in shape of strip on said source region through a lower insulating film, said word lines being in parallel to each other:

gate oxide films formed respectively on both side walls of each of said word lines;

silicon epitaxial layers formed on said source region in contact with said gate oxide films and located between said word lines;

upper insulating films formed on each of said word lines;

a plurality of strip-like bit lines formed in parallel to each other on said upper insulating films and on said silicon epitaxial layers in a direction crossing over said word lines; and drain regions formed respectively in surface regions of said silicon epitaxial layers located under said bit lines and in contact with said bit lines;

wherein each of said silicon epitaxial layers has a channel region in a surface region thereof facing the gate oxide films, and wherein impurities are introduced into said channel regions of a semiconductor memory element in which data should be stored, thereby to [raise]set a threshold voltage of the semiconductor memory element.

* * * * *